United States Patent [19]

Neidig et al.

[11] Patent Number: 4,505,418

[45] Date of Patent: Mar. 19, 1985

[54] METHOD OF DIRECT BONDING COPPER FOILS TO OXIDE-CERAMIC SUBSTRATES

[75] Inventors: Arno Neidig, Plankstadt; Dietmar Berndt, Heidelberg; Georg Wahl, Eppelheim, all of Fed. Rep. of Germany; Mark Wittmer, Baden, Switzerland

[73] Assignee: Brown, Boveri & Cie AG, Mannheim, Fed. Rep. of Germany

[21] Appl. No.: 561,124

[22] Filed: Dec. 12, 1983

Related U.S. Application Data

[63] Continuation of Ser. No. 286,453, Jul. 24, 1981, abandoned.

[30] Foreign Application Priority Data

Sep. 25, 1980 [DE]  Fed. Rep. of Germany ....... 3036128

[51] Int. Cl.$^3$ .............................................. B23K 31/02
[52] U.S. Cl. .................................. 228/122; 228/124; 228/198; 228/219

[58] Field of Search ............... 228/122, 124, 198, 219, 228/903

[56] References Cited

U.S. PATENT DOCUMENTS 3,766,634  10/1973  Babcock et al. ..................... 228/188
3,911,553  10/1975  Burgess et al. ................. 228/903 X
3,994,430  11/1976  Cusano et al. ....................... 228/122

*Primary Examiner*—Nicholas P. Godici
*Assistant Examiner*—M. Jordan
*Attorney, Agent, or Firm*—Herbert L. Lerner; Laurence A. Greenberg

[57] ABSTRACT

Method for directly bonding copper foils having a copper oxide layer to oxide-ceramic substrates by heating the ceramic substrate covered with the copper foil in an oxygen-containing atmosphere to a temperature above the eutectic temperature of Cu and $Cu_2O$, but below the melting temperature of copper in a vacuum furnace at a pressure of not more than 1 mbar while maintaining a furnace atmosphere with a partial oxygen pressure between 0.001 and 0.1 mbar.

5 Claims, No Drawings

METHOD OF DIRECT BONDING COPPER FOILS TO OXIDE-CERAMIC SUBSTRATES

This application is a continuation of application Ser. No. 286,453 filed July 24, 1981, now abandoned.

BACKGROUND OF THE INVENTION

1. Field of the Invention

The invention relates to a method for directly bonding copper foils which carry a copper oxide layer on the surface, to oxide-ceramic substrates by heating the ceramic substrate covered with the copper foil in an oxygen-containing atmosphere to a temperature above the eutectic temperature of Cu and $Cu_2O$, but below the melting temperature of copper.

2. Description of the Prior Art

Methods for the direct bounding of copper and oxide ceramic are known, for instance, from U.S. Pat. Nos. 3,766,634, 3,911,553 and 3,994,430, British Pat. Nos. 761,045 and 784,931 as well as U.S. Pat. Nos. 3,010,188 and 3,676,292. In addition, further publications are known which go back to the work of the inventors named in the above-mentioned patents.

Strongly adhering and vacuum-tight joints between copper and glass or ceramic have been widely accepted in the past in the manufacture of vacuum tubes. Reference is made, for instance, to the book by W. Espe: "Werkstoffkunde der Hochvakuumtechnik", (Materials of High Vacuum Engineering) VEB Deutscher Verlag der Wissenschaften, Berlin 1959, where on pages 301 and 302 it is explained that "the P-content of copper must not exceed 0.005% because otherwise the copper oxide coating necessary for vacuum-tight fusing does not adhere sufficiently strongly to the mother copper". Other general references are also found in Lueger "Lexikon der Fertigungstechnik und Arbeitsmaschinen" (Lexicon of Manufacturing Techniques and Machine Tools) Deutsche Verlags-Anstalt Stuttgart 1967, keyword "Glass". In U.S. Pat. No. 3,994,430, a method is described in which a metal foil, preferably of copper, is first oxidized to a thickness between 200 and 500 Å, and the metal foil with the oxide layer is brought into contact with an oxide-ceramic substrate, preferably of aluminum or berylium oxide. The metal foil and the substrate are heated in an inert atmosphere at a temperature between the eutectic temperature (1065° C.) of copper and copper oxide and the melting temperature (1083° C.) of copper until an undereutectic melt between copper and the substrate has been formed. Heating in an inert atmosphere does not lead to the desired strongly adhering bond between copper and ceramic, since at the process temperatures provided, CuO is reduced to $Cu_2O$ and $Cu_2O$ is reduced to Cu, unless a certain minimum partial oxygen pressure is maintained in the surrounding atmosphere. Publication of the Academy of Sciences of the USSR, Institute for Metallurgy A. A. Baikof: "Pressure and Composition of the Vapor over the Oxides of the Chemical Elements" by E. K. Kasenas and D. M. Tschischikof, Moskau 1976, Pages 145 to 150, particularly FIG. 28 on Page 147. However, reduced copper does not form a junction with ceramic. In U.S. Pat. No. 3,994,430 it is also proposed to use an oxygen-containing copper material without an oxide coating instead of the preoxidized copper. Apart from the fact the no bond between copper and ceramic can be produced here unless a minimum oxygen partial pressure is maintained in the oven atmosphere, it has been found in tests that the oxygen dissolved in the metal diffuses at the contact surface between copper and ceramic and remains occluded there, which leads to the formation of bubbles and therefore to an insufficient bond between the metal and the ceramic.

The method described in U.S. Pat. No. 3,766,634 differs from that described above in that a bare, not peroxidized metal foil, particularly of copper is to be bonded in a reactive, particularly oxygen-containing atmosphere to the oxide-ceramic substrate. In this method, the oxygen in the atmosphere must first oxidize the copper superficially before the bonding process proper can start. It has been found, however, that particularly in large-area joints between the ceramic and the copper, the oxygen cannot penetrate in sufficient amounts into the gap between the ceramic and the copper, so that bubble-like areas without adhesion are produced. There is further the danger, that with the given amounts of oxygen, the copper foil is coated on the side facing away from the ceramic substrate with a thick copper oxide layer which must be removed again in an additional operation before further processing is possible, particularly in the semiconductor industry. It is suggested specifically not to use an oxygen content of less than 0.01% by volume, since then no bond between copper and ceramic is supposed to be possible.

The "improved" method described in U.S. Pat. No. 3,911,553 again uses preoxidized copper in order to make possible adhesion at all points, and this applied also for large area joints. In addition, the copper foil is present in such manner that it contacts the ceramic substrate only gradually when being heated. This is supposed to push any gas bubbles outward. However, this method is expensive and complicated; also, if the copper foil and/or ceramic are preformed in a complicated manner, it is not always possible to bend the copper foil or the foil does not lie uniformly against the substrate. In addition, with the amount of oxygen of 0.01 to 0.5% by volume given in the patent application, the exposed copper surface is coated with a thick black oxide layer which must be subsequently removed.

SUMMARY OF THE INVENTION

It is an object of the present invention to further develop the known method which was described last in such manner that a bubblefree bond is obtained between the copper foil and the ceramic and at the same time a practically oxide-free copper surface is obtained.

With the foregoing and other objects in view, there is provided in accordance with the invention a method for the direct bonding of copper foils which carry a copper oxide layer on the surface, to oxide-ceramic substrates by heating the ceramic substrate covered with the copper foil in an oxygen-containing atmosphere to a temperature above the eutectic temperatures of Cu and $Cu_2O$ but below the melting temperature of Cu, in a vacuum furnace at a pressure not more than 1 mbar and maintaining a furnace atmosphere with a partial oxygen pressure between 0.001 and 0.1 mbar.

Other features which are considered as characteristic for the invention are set forth in the appended claims.

Although the invention is illustrated and described herein as embodied in a method of directly bonding copper foils to oxide-ceramic substrates, it is nevertheless not intended to be limited to the details shown, since various modifications may be made therein without departing from the spirit of the invention and within the scope and range of equivalents of the claims.

The invention, however, together with additional objects and advantages thereof will be best understood from the following description.

DETAILED DESCRIPTION OF THE INVENTION

In accordance with the invention the heating is performed in a vacuum furnace at a pressure of at most 1.0 and preferably 0.1 mbar, and a partial oxygen pressure between 0.001 and 0.1 mbar is maintained in the furnace atmosphere.

Thereby, the advantages obtained are that the copper foil can be placed flat on the ceramic substrate; that possible gas residues between the metal foil and the substrate are suctioned off; that contrary to the known methods, which all take place at atmospheric pressure, only various small amounts of gas, inert gas and oxygen, are consumed; that a firm joint between copper and ceramic is obtained; that the chemically necessary minimum oxygen pressure in the vacuum atmosphere is not exceeded, nor its value falls below a given value; and that the copper surface is, surprisingly, practically free of oxide. The bond between copper and ceramic comes about with this method also at partial oxygen pressures, which are in part considerably below the values in the above-mentioned patents.

Preferably, high purity aluminum oxide ceramic with a particularly smooth surface is used. Such substrates are used preferably in thin-film technology. High purity ceramic has better heat conduction and smoother, flatter surfaces than less pure ceramic as is presently used in thick-film technology. The occlusion of gas bubbles is less probable if thick-film ceramics with their surface roughness of about 1 $\mu$m are used than with thin-film ceramic with substantially less surface roughness, since in the former case, the gas bubbles can escape when the $Cu_2/O/Cu$ eutectics are melted, usually via the surface depressions before the bonding process is completed.

It is, therefore, a particular advantage of the vacuum method that very smooth thin-film ceramic substrate can be without great effort bonded over large surfaces without bubbles to metal foil. From the fact that the process according to the invention is carried out in a vacuum, no impediments result if the vacuum furnace is filled and emptied via locks.

After the bond between the ceramic and the copper has been made, the partial oxygen pressure in the vacuum furnace is preferably held during the cooling between 1065° C. and about 250° C. at values below 0.005 mbar. Then, the exposed copper surfaces come out of the furnace metallically bare.

Advantageously, the total pressure in the furnace is at most 0.1 mbar. That means that practically no other reactive gas except oxygen is present in technically appreciable quantities.

The method according to the invention will be explained in detail with the aid of an embodiment example. First, a copper foil is oxidized on at least one side. The thickness of the oxide corresponds approximately to the surface roughness of the ceramic. The oxidation can be preformed chemically or thermally; there are practically no differences between them for the further processing. Subsequently, the copper foil is placed with the oxidized side flat on a ceramic substrate. To equalize thermal stresses due to the different thermal expansion of copper and ceramic, copper foils may be provided on both sides of the ceramic substrates.

To start, the vacuum furnace is purged with nitrogen before it is heated up and is flushed after the heating. Subsequently, it is evacuated to a total pressure of maximally 1 mbar and preferably 0.1 mbar. The substrates covered with copper foil are pushed, lying on carriers, through the vacuum furnace by means of locks. The temperature in the reaction zone of the vacuum furnace is between the melting temperature of the eutectic $Cu_2O/Cu$ and the melting point of the copper, i.e. at 1072° C. In the interior of the furnace, a partial oxygen pressure between 0.01 mbar and 0.03 mbar prevails, where the total pressure of the furnace atmosphere should not exceed 1.0 mbar and preferably 0.1 mbar. The partial oxygen pressure is necessary so that the $Cu_2O$ which is so important for the bonding process, is not reduced.

The substrates remain in the high-temperature reaction zone for a few minutes. As soon as the bonding process is finished and the temperature of the substrates is below 1065° C., the partial oxygen pressure is lowered to values below $5 \times 10^{-3}$ mbar, until the temperature of the substrate is below about 250° C. The substrates can be taken out of the furnace with metallically bare copper surfaces and there is practically no after-oxidation. A possible oxide content is so small that it can be removed readily in a subsequent soldering operation by conventional flux media. The copper adheres to the ceramic without bubbles and so well that in pulling tests, parts of the ceramic are torn off together with the copper.

We claim:

1. Method for the direct bonding of copper foils which carry a copper oxide layer on the surface, to oxide ceramic substrates which comprises disposing a copper foil having a copper oxide layer on the surface on a ceramic substrate with the copper oxide layer in contact with the ceramic substrate, heating the ceramic substrate covered with the copper foil in an oxygen-containing atmosphere to a temperature above the eutectic temperature of Cu and $Cu_2O$ but below the melting temperature of Cu, in a vacuum furnace at a pressure not more than 1 mbar and maintaining a furnace atmosphere with a partial oxygen pressure between 0.001 and 0.1 mbar, and cooling down the heated ceramic substrate during which cooling-down the partial oxygen pressure is kept below 0.005 mbar.

2. Method according to claim 1, wherein the oxide-ceramic is high-purity aluminum-oxide ceramic with a smooth surface.

3. Method according to claim 1, wherein the oxide-ceramic substrates are moved into the vacuum furnace through a lock and removed from the furnace through a lock.

4. Method according to claim 1, wherein the pressure in the vacuum furnace is at most 0.1 mbar.

5. Method according to claim 2, wherein the pressure in the vacuum furnace is at most 0.1 mbar.

* * * * *